(12) United States Patent
Usuda et al.

(10) Patent No.: US 8,017,979 B2
(45) Date of Patent: Sep. 13, 2011

(54) SEMICONDUCTOR DEVICE AND METHOD FOR MANUFACTURING THE SAME

(75) Inventors: Koji Usuda, Yokohama (JP); Yoshihiko Moriyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 12/562,980

(22) Filed: Sep. 18, 2009

(65) Prior Publication Data

US 2010/0072549 A1    Mar. 25, 2010

(30) Foreign Application Priority Data

Sep. 24, 2008 (JP) .................................. 2008-243975

(51) Int. Cl.
*H01L 29/739* (2006.01)
*H01L 31/109* (2006.01)
*H01L 27/12* (2006.01)
*H01L 21/336* (2006.01)
*H01L 29/786* (2006.01)

(52) U.S. Cl. . 257/194; 257/192; 257/347; 257/E21.415; 257/E29.273

(58) Field of Classification Search .................. 257/192, 257/194, 347
See application file for complete search history.

(56) References Cited

U.S. PATENT DOCUMENTS

| | | | | |
|---|---|---|---|---|
| 7,282,402 B2 * | 10/2007 | Sadaka et al. | ............... | 438/221 |
| 7,557,388 B2 * | 7/2009 | Lee et al. | ............... | 257/191 |
| 7,585,711 B2 * | 9/2009 | Chen et al. | ............... | 438/154 |
| 2005/0242340 A1 * | 11/2005 | Chidambarrao et al. | ....... | 257/19 |
| 2007/0200179 A1 * | 8/2007 | Chen | ............... | 257/369 |
| 2008/0078996 A1 * | 4/2008 | Usuda | ............... | 257/48 |

FOREIGN PATENT DOCUMENTS

| | | |
|---|---|---|
| JP | 10-012883 | 1/1998 |
| JP | 2008-515188 | 5/2008 |
| WO | WO 2006/039038 | 4/2006 |

OTHER PUBLICATIONS

Usuda, K. et al., "Characterization of In-Plane Strain Relaxation in Strained Layers Using a Newly Developed Plane nano-Beam Electron Diffraction (Plane-NBD) Method," Semicond. Sci. Technol., vol. 22, pp. S227-S230, (2007).

Tezuka, T. et al., "Novel Fully-Depleted SiGe-on-Insulator pMOSFETs with High-Moblility SiGe Surface Channels," IEEE, IEDM Tech. Dig., vol. 946, 3 Sheets, (2001).

Notification of Reasons for Rejection issued by the Japanese Patent Office on Jan. 21, 2011, for Japanese Patent Application No. 2008-243975 and English-language translation thereof.

T. Irisawa et al., "High Performance Multi-Gate pMOSFETs using Uniaxially-Strained SGOI Channels," IEICE technical report, Silicon devices and materials, Jan. 13, 2006, 105(541), pp. 1-4.

* cited by examiner

*Primary Examiner* — Luan C Thai
(74) *Attorney, Agent, or Firm* — Finnegan, Henderson, Farabow, Garrett & Dunner, L.L.P.

(57) ABSTRACT

It is made possible to restrict strain relaxation even if a strained semiconductor element is formed on a very small minute layer. A semiconductor device includes: a substrate; a first semiconductor layer formed into a mesa shape above the substrate and having strain, and including source and drain regions of a first conductivity type located at a distance from each other, and a channel region of a second conductivity type different from the first conductivity type, the channel region being located between the source region and the drain region; second and third semiconductor layers formed on the source and drain regions, and controlling the strain of the first semiconductor layer, the second and third semiconductor layers containing impurities of the first conductivity type; a gate insulating film formed on the channel region; and a gate electrode formed on the gate insulating film.

4 Claims, 9 Drawing Sheets

| n-MOSFET | p-MOSFET |
|---|---|
| TENSILE STRAIN | NO STRAIN |
| NO STRAIN | COMPRESSIVE STRAIN |
| TENSILE STRAIN | COMPRESSIVE STRAIN |

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2008-243975 filed on Sep. 24, 2008 in Japan, the entire contents of which are incorporated herein by reference.

BACKGROUND

1. Technical Field

Disclosure generally relates to a semiconductor device having a strained semiconductor layer, and a method for manufacturing the semiconductor device.

2. Related Art

The performance of Si-LSI semiconductor elements, especially the performance of Si-MOSFETs, is becoming more and more sophisticated, as the LSI technique is becoming more and more advanced. In recent years, however, the limit of the lithography technique is pointed out from a viewpoint of the processing technology, and the saturation of carrier mobility is pointed out from a viewpoint of element physics. Accordingly, the difficulty in improving the performance of Si-LSI semiconductor elements is becoming greater.

Recently, attention is drawn to a technique by which "strain" is applied to an active layer for device formation, as a technique for increasing the electron mobility and the hole mobility that are a barometer of sophistication of Si-MOSFETs. When strain is applied to an active layer, a change is caused in the band structure of the active layer, and the carrier scattering in the channel is restrained. Accordingly, the carrier (electron, hole) mobility is improved. More specifically, a compound semiconductor crystal layer made of a material having a larger lattice constant than Si, such as a strain-relaxed SiGe compound semiconductor crystal layer (hereinafter referred to simply as the SiGe layer), is formed on a Si substrate. A Si layer is formed on the SiGe layer. As a result, a strained Si layer having strain applied thereto due to the difference in lattice constant is formed. There have been reports that, where such a strained Si layer is used as the channel, improved electron mobility approximately 1.76 times as high as the electron mobility observed in a case where a relaxed Si layer is used as the channel is achieved.

As a technique for forming a strained Si channel on a SOI (Semiconductor On Insulator) structure, there has been a known technique by which a strained Si layer is formed on a SiGe layer formed on a buried oxide layer (BOX layer) on a Si substrate. With this structure, the short channel effect (SCE) in the MOSFET is prevented, and a high-performance semiconductor device is realized.

To obtain even more sophisticated semiconductor elements and achieve miniaturization of the semiconductor elements, a more advanced strain controlling technique is necessary. In recent years, there has been a MOSFET formed on a substrate having strain uniformly applied to the active layer thereof, or a so-called globally-strained substrate. Such a MOSFET has a so-called "biaxially-strained" channel layer to which strain is uniformly applied in the gate length direction (hereinafter also referred to as the Lg direction) parallel to the source/drain direction of the MOSFET, and in the gate width direction (hereinafter also referred to as the Wg direction) perpendicular to the gate length direction. However, it has also been suggested that the characteristics of a semiconductor element can be improved ever with the use of a so-called "uniaxially-strained" channel layer, instead of the "biaxially-strained" channel layer. In the "uniaxially-strained" channel layer, strain is applied in a desired direction, so that the strain in the Lg direction and the strain in the Wg direction become different from each other.

In a semiconductor device of the "hp45 generation" or later that has become smaller with the improvement of the device performance and has a high probability of usage of the above strained semiconductor element, the gate length Lg of the channel in the carrier moving direction is considered to be 50 nm or less. In this case, the size of the active layer forming the source and drain regions and the gate regions for device formation becomes even smaller with the improvement of the integration level. For example, the size of each cell used in a SRAM that is a typical memory is less than 0.1 $\mu m^2$. More specifically, six transistors are formed in a region as small as 0.1 $\mu m^2$, and the allowed size of the active layer of each transistor is smaller than 0.5 $\mu m = 500$ nm in one side length. The active layer of each transistor is formed through mesa isolation of the above-mentioned globally-strained substrate. Therefore, the strain of the active layer might be relaxed due to the pattern size, shape, thickness, or substrate dependence, and systematic studies are required. In other words, to effectively use a strained channel in a state-of-the-art MOSFET, how the strain in the active layer is controlled is an important issue.

Examples of strain measurement methods that are effective in evaluating the characteristics of strained semiconductor elements and are used most widely today include Raman measurement. However, the spot diameter of the laser beam used in the Raman measurement is normally in the neighborhood of half a micron meter (approximately 500 nm in the current experiment level), and is larger than 100 nm or less, which is the spatial resolution required for solving the above-mentioned problem. Also, since the results of Raman measurement are average information in the measured region, it is very difficult to isolate and quantitatively evaluate the strain in a desired direction in a strained semiconductor channel layer formed with the use of the above described globally-strained substrate.

As described above, in a strained semiconductor element, unintended strain relaxation is caused due to miniaturizing and thinning of the channel layer, and the device characteristics improvement by strain might not be achieved. Still, it is not easy to accurately and directly evaluate the strain, and it is difficult to control the strain. Furthermore, controlling the strain applying direction is also important in improving the device characteristics. Still, it is difficult to directly evaluate the strain, and it is even more difficult to control the strain distribution.

The results of the later described studies made by the inventors show that the main cause of strain relaxation greatly depends on the formation of free edges that release the strain, and the relaxation becomes larger more easily if the size of the strained layer is smaller in a case where the strained layer is surrounded by free edges as in a case where the mesa formed on the substrate has a square shape (see K. Usuda, et al., ISTDM06, (2006), for example).

SUMMARY

Possible embodiments are made in view of these circumstances, and some embodiments may provide a semiconductor device that can restrict strain relaxation even if a strained semiconductor element is formed on a very small minute layer, and a method for manufacturing such a semiconductor device.

A semiconductor device according to a first aspect of the present invention includes: a substrate; a first semiconductor layer formed into a mesa shape above the substrate and having strain, and including source and drain regions of a first conductivity type located at a distance from each other, and a channel region of a second conductivity type different from the first conductivity type, the channel region being located between the source region and the drain region; second and third semiconductor layers formed on the source and drain regions, and controlling the strain of the first semiconductor layer, the second and third semiconductor layers containing impurities of the first conductivity type; a gate insulating film formed on the channel region; and a gate electrode formed on the gate insulating film.

A method for manufacturing a semiconductor device according to a second aspect of the present invention includes: forming a first semiconductor layer having strain above a substrate; forming a second semiconductor layer on the first semiconductor layer, the second semiconductor layer controlling the strain of the first semiconductor layer; patterning the second semiconductor layer and the first semiconductor layer into mesa shapes, and dividing the second semiconductor layer having the mesa shape into first and second semiconductor regions isolated from each other through patterning; forming a gate insulating film on a portion of the first semiconductor layer, the portion being located between the first semiconductor region and the second semiconductor region; forming a gate electrode on the gate insulating film; and forming a source region and a drain region by introducing impurities into at least the first and second semiconductor regions.

A method for manufacturing a semiconductor device according to a third aspect of the present invention includes: forming a first semiconductor layer having strain above a substrate; forming a protection film selectively on a region of the first semiconductor layer, a gate being to be formed on the region; forming a second semiconductor layer on first portions of the first semiconductor layer, the first portions being other than the region on which the protection film is formed, the second semiconductor layer controlling the strain of the first semiconductor layer; patterning the protection film, the second semiconductor layer, and the first semiconductor layer into mesa shapes, and removing the protection film; forming a gate insulating film on a second portion of the first semiconductor layer, the protection film having been removed from the second portion of the first semiconductor layer; forming a gate electrode on the gate insulating film; and forming a source region and a drain region by introducing impurities into at least the second semiconductor layer.

DETAILED DESCRIPTION

Before describing the embodiments, the course of events for achieving the present invention will be described below.

First, to check the strain relaxation of an active layer having strain applied thereto in the miniaturizing of a strained semiconductor element, the inventors systematically carried out an experiment on the strain relaxation after the pattern formation of a strained active layer by mesa etching, with the mesa shape being varied to the size of 1 μm or smaller. A SGOI (SiGe On Insulator) substrate that has a thickness of approximately 40 nm and has compressive strain was prepared as a strained substrate. The Ge composition ratio x of the SGOI layer of the SGOI substrate was 0.23. The mesa shapes formed on the SGOI substrate were the following three types: 1) the same as the substrate; 2) an H-shape typically used in the manufacture of MOSFETs; and 3) an isolated square. The minimum width Wg of each of the mesa shapes was 0.3 μm. To evaluate strain, NBD (nano-beam electron-diffraction) was used, because NBD had spatial resolution as small as 10 nm, and strain measurement accuracy of 0.1%. NBD is suitable for evaluating the strain relaxation of a globally-strained substrate typically having strain of the order of several percents.

Figure 1:
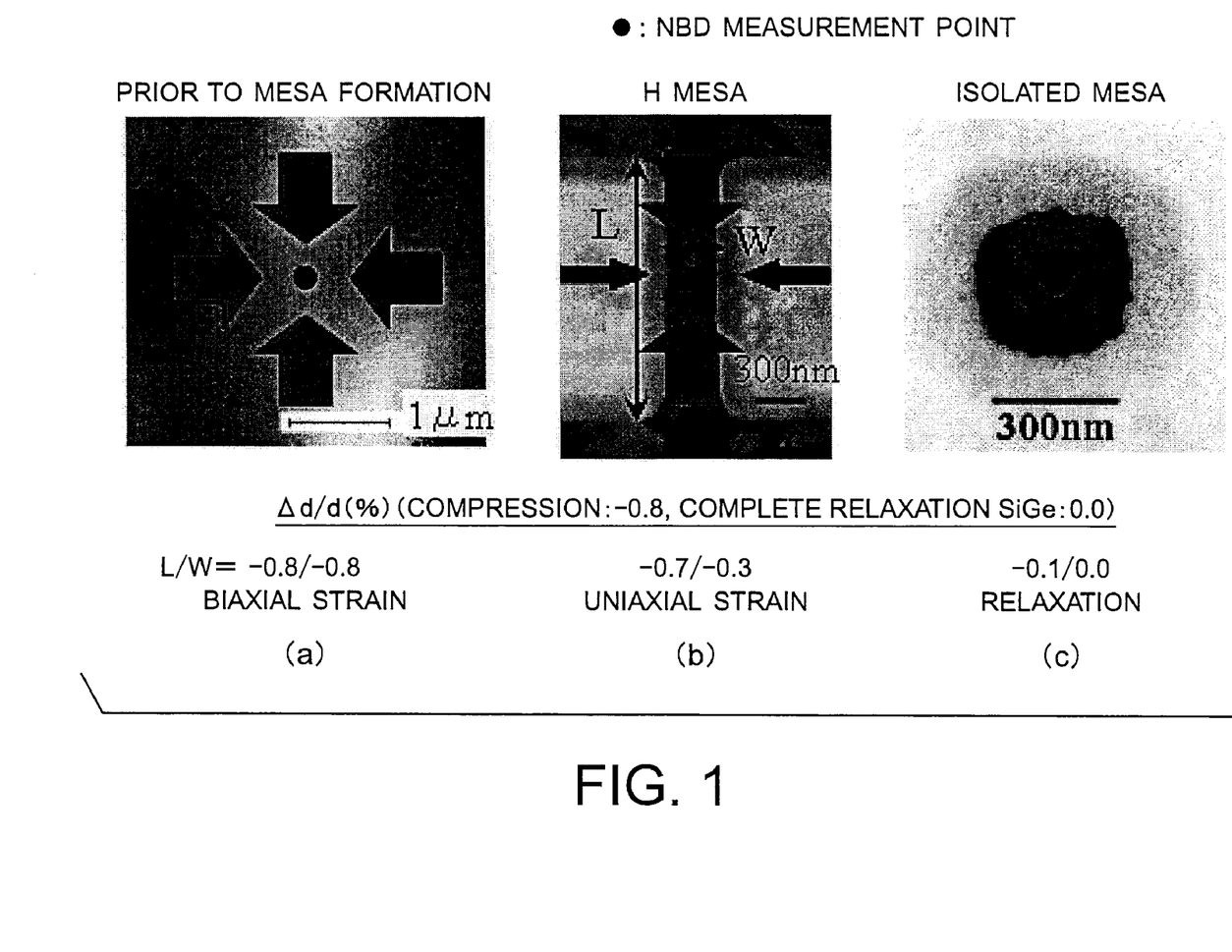
FIGS. 1(a), 1(b), and 1(c) show the results of strain evaluations.

As a result of this experiment, the strain of the samples was not changed and the relaxation of the strain was not caused in the substrate prior to mesa formation, but a change was observed in a narrow region at the center of the H-shaped mesa shape that was often used in the manufacture of MOSFETs (FIGS. 1(a) and 1(b)). More specifically, the relaxation of the strain in the gate length direction parallel to the source/drain direction or the Lg direction remained small, but the strain relaxation in the gate width direction perpendicular to the gate length direction or the Wg direction was large, and so-called uniaxial strain relaxation was caused. This was because edge portions were formed in the strained layer through the mesa etching, and the strain was released from the end portions. In the square-shaped isolated mesa, the ratio of the edge relaxation to the total area of the mesa became higher, as the size became smaller. In a square-shaped mesa of approximately 300 nm in size, large strain relaxation was caused (FIG. 1(c)). Thus, it became apparent that the main cause of strain relaxation greatly depends on the formation of free edges that relaxes strain. In a case where the strained layer is surrounded by free edges as in the square-shaped mesa, the relaxation became larger as the size became smaller. In FIGS. 1(a), 1(b), and 1(c), $\Delta d/d_0$ represents the strain relaxation rate, $d_o$ represents the lattice constant observed when there is no strain, $d_1$ represents the lattice constant observed when strain is caused, and $\Delta d$ is determined by $d_1$-$d_0$.

Figure 2:
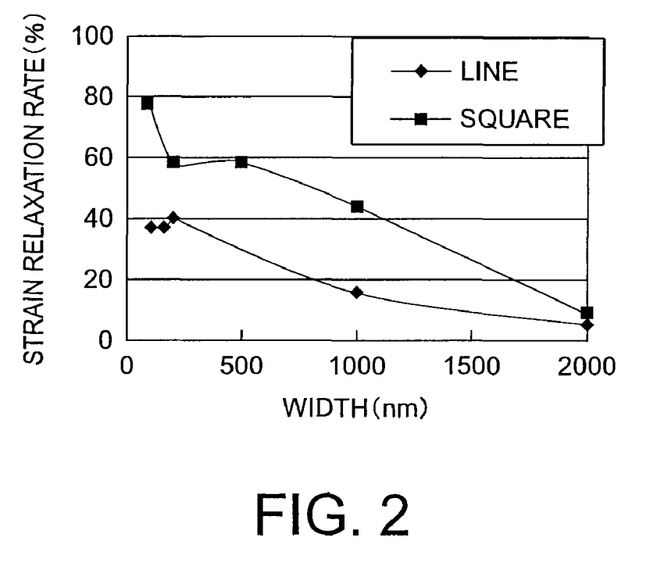
FIG. 2 shows the results of other strain evaluations.

The above phenomenon is also seen in a Fin-FET that is a widely expected to be the next-generation transistor that is further developed from conventional MOSFETs. FIG. 2 shows the results of evaluations through Raman measurement to measure the strain relaxation rate where the minimum Fin width is as small as 50 nm. In FIG. 2, the measurement result indicated by "line" is the result of measurement carried out on a Fin sample having a sufficient length in the line direction (the gate length direction). In this example, there are mesa edges that contribute to relaxation only in the W direction. Accordingly, the strain in the longitudinal direction is maintained, though relaxation is caused in the W direction. The Raman measurement result shows approximately 40% relaxation. In a square-shaped sample (indicated by "square" in FIG. 2) having the mesa etching performed equally in the W direction and the L direction, the strained layer is surrounded by mesa edges causing relaxation in the four directions. Therefore, the strain relaxation rate is much larger than the strain relaxation rate observed in the case of "line", and becomes as high as 80% or more in a sample of 100 nm or less in size.

As is apparent from those results, strain relaxation is caused mainly by the formation of free edges relaxing strain, and the relaxation is larger in a strained layer of a smaller size than several hundreds of nanometers, over which relaxation from the each free edge can extend within the entire strained layer. Therefore, as described earlier, to form an element having a strained channel on a globally-strained substrate in a small-sized device of the next generation or later, control operations need to be performed to restrict strain relaxation.

In view of this, the inventors made intensive studies to obtain a semiconductor device that can restrict strain relaxation even if a strained semiconductor element is formed on a minute active layer, and to also obtain a method for manufacturing the semiconductor device. In the following, the semiconductor device is described as embodiments in detail, with reference to the accompanying drawings.

First Embodiment

Figure 3:
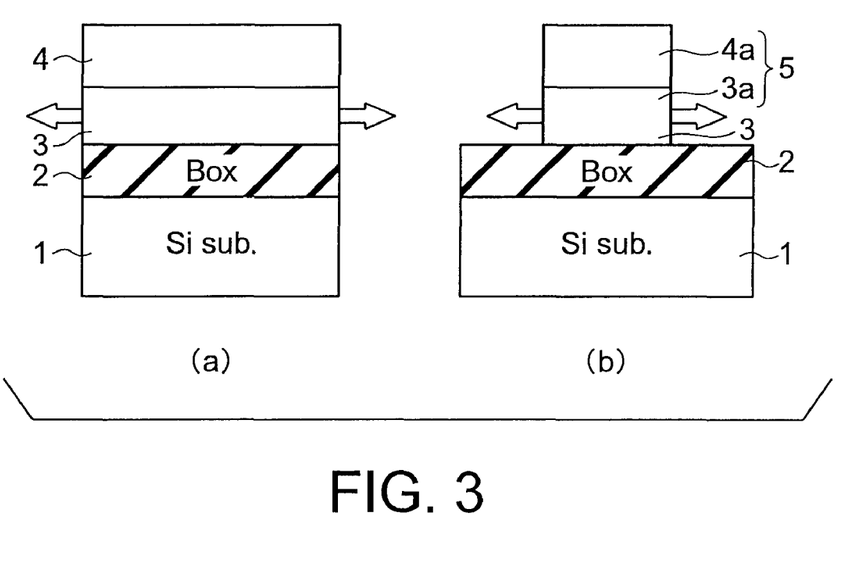
FIGS. 3(a) and 3(b) are cross-sectional views for explaining a method for manufacturing a semiconductor device according to a first embodiment.

Referring to FIGS. 3(a) and 3(b), a semiconductor device according to a first embodiment is described. FIGS. 3(a) and 3(b) are cross-sectional views showing the procedures for manufacturing the semiconductor device of this embodiment. As shown in FIG. 3(a), in the semiconductor device of this embodiment, a buried oxide layer 2 made of $SiO_2$, a strained Si layer (a first semiconductor layer) 3, and a strain control layer (a second semiconductor layer) 4 made of SiGe (silicon germanium) that controls the strained Si layer 3 to maintain its strain are formed in this order on a Si (silicon) substrate 1. In the formation of the semiconductor device of this embodiment, a substrate that has the strain control layer 4 formed beforehand on the strained Si layer 3 may be used, or the strain control layer 4 may be formed on the strained Si layer 3 before the manufacture of the device.

In a case where the strain control layer 4 is formed on the substrate 1 having the strained Si layer 3 formed thereon, techniques such as MBE (Molecular Beam Epitaxy), CVD (Chemical Vapor Deposition), sputtering, liquid phase growth, and printing may be used in the formation of the strain control layer 4. If the strain control layer 4 is formed by CVD, for example, the natural oxide layer of the surface of the strained Si layer 3 is removed beforehand with a diluted HF solution or the like. After that, a gas such as a $SiH_4$ gas, a $Si_2H_6$ gas, a dichlorosilane gas, a trichlorosilane gas, a $GeH_4$ gas, or a $Ge_2H_6$ gas, which is at room temperature or is heated to a temperature between room temperature and 1000° C., is introduced into the surface to form the strain control layer 4. In this embodiment, the strain applied to the strained Si layer 3 is approximately 1% of tensile strain, for example. The Ge composition of the strain control layer 4 of SiGe formed on the strained Si layer 3 is 23%. Accordingly, the strain control layer 4 of SiGe is formed as if it were a relaxed SiGe layer on a base layer having the same lattice constant. In this structure, a substrate having the strain control layer 4 of SiGe formed on the strained Si layer 3 may be used, where the structure is formed by a so-called bonding technique by which the substrate is bonded to a bonding face that is the upper face, an inner face, or the lower face of the buried oxide layer 2 of $SiO_2$.

In the above example, the substrate is formed by a bonding technique. However, in a case where a strained SiGe layer is used in place of the above strained Si layer 3, a SOI substrate including a Si substrate, an insulating layer, and a Si layer is prepared. A SiGe layer is formed with a Si raw material gas and a Ge raw material gas on the SOI substrate heated to 550° C. Oxidation is then performed under oxygen atmosphere, which is typical of an enrichment method (see T. Tezuka, et al., IEDM Tech. Dig., 946 (2001), for example). In this manner, a SOI substrate including a Si substrate, an insulating layer, and a strained SiGe layer can be formed. A Si layer may be formed as a strain control layer on the strained SiGe layer through the above described procedures, for example.

The same effects as those of this embodiment can be achieved with a conventional bulk substrate such as a Si substrate, instead of the substrate having the above described SOI structure. In such a bulk substrate, a thick relaxed SiGe buffer layer is formed on a Si substrate, and a strained Si layer is formed on the buffer layer.

As shown in FIG. 3(b), an active layer for forming a semiconductor device is then formed on the substrate formed in the above manner. First, with the use of a mask (not shown) formed beforehand on the strain control layer 4, patterning is performed on the strain control layer 4 and the strained Si layer 3 by RIE (Reactive Ion Etching), for example, so as to form the active layer 5 having a stacked structure formed with a strained Si layer 3a and a strain control layer 4a. The patterning may also be performed by wet etching or FIB (Focus Ion Beam), for example, instead of RIE. The mesa forming strained Si layer 3a obtained in this manner is expected to restrain itself from relaxing the strain, because of the existence of the mesa forming strain control layer 4a remaining on the strained Si layer 3a.

Figure 4:
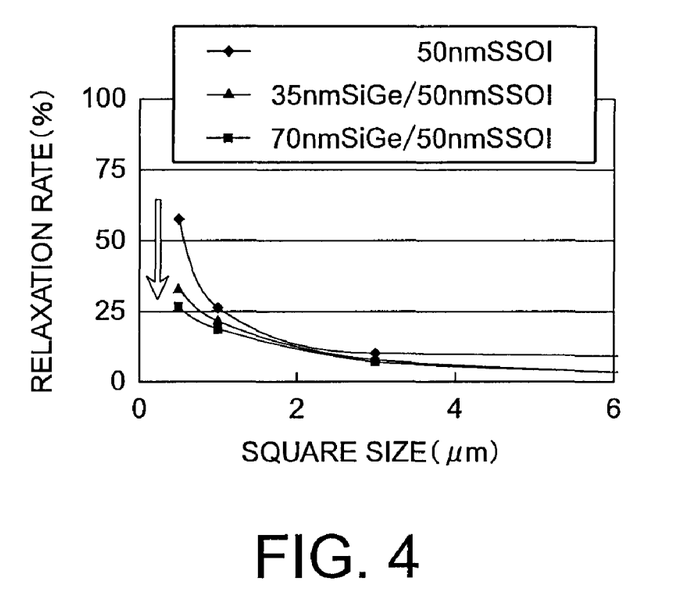
FIG. 4 illustrates the dependence of strain relaxation on the device size.

To confirm the above aspect of the embodiment, samples are formed as typical examples. More specifically, SiGe layers of approximately 24% in Ge concentration are formed respectively on a substrate having a SSOI (strained Si on insulator) layer that has approximately 0.8% of tensile strain applied thereto and is 50 nm in thickness. The SiGe layers have different thickness each other. Etching is then performed down to the SSOI layer, so as to form each sample that has a strained layer of an isolated mesa shape (a square shape). This strained layer has a stacked structure formed with a SSOI layer and a SiGe layer. The prepared samples are the following three: a first sample including a 50-nm thick SSOI substrate on which a SiGe layer is not formed; a second sample having a mesa of a 35-nm SiGe layer formed on a 50-nm thick SSOI substrate; and a third sample having a mesa of a 70-nm thick SiGe layer formed on a 50-nm thick SSOI layer. In the first sample, the mesa is formed only with a SSOI layer. Samples having mesas of different sizes from the mesa of those three samples are also prepared. Raman measurement is carried out on those samples, and the results of evaluations on strain relaxation are shown in FIG. 4. In the Raman measurement, the strain at the center of each sample is measured with the use of a light beam of approximately 1 µm in spot diameter. In each mesa sample having a larger size than the spot diameter of the used light beam, only the strain relaxation at the center of the sample is evaluated. In each mesa sample having a smaller size than the spot diameter of the used light beam, the strain relaxation of the entire sample is evaluated. As a result, where the mesa size is equal to or greater than 1 µm, the strain relaxation rate is low, regardless of the thickness of the strain control layer located on the sample. As the mesa becomes smaller in size, the size difference due to the difference in the thickness of the strain control layer becomes more remarkable. Particularly, it has become apparent for the first time that, where the mesa size is 2 µm or smaller, the increase in the strain relaxation rate becomes smaller, as the strain control layer becomes thicker.

Figure 5:
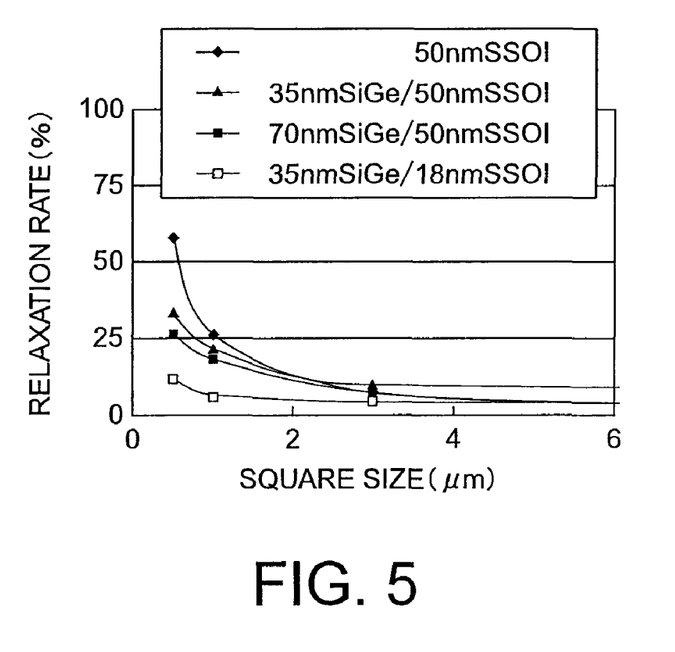
FIG. 5 illustrates the dependence of strain relaxation on the device size.

Samples each having a mesa of a 35-nm thick SiGe layer formed on a substrate including a 18-nm SSOI layer are also prepared, with the mesa size being varied. Raman measurement is also carried out on those samples, and the results of strain relaxation examinations are shown in FIG. 5. FIG. 5 also shows the results shown in FIG. 4. As can be seen from FIG. 5, more relaxation is allowed, as the mesa size becomes smaller, as in the case 1 shown in FIG. 4. However, the strain relaxation rate can be restricted to as low as the order of 10% in mesas having a size of 1 µm or smaller. Accordingly, it has become apparent that strain relaxation can be further restricted by making the strained layer thinner than the strain control layer.

Where actual semiconductor elements are formed, the thicknesses of the strained layers and the strain control layers and the amount of strain (the Ge composition) should vary over wide ranges, according to device design requests. However, strain relaxation can be restricted as in this embodiment, as long as the mesa size is 10 µm or smaller.

In the procedure to be carried out after the procedure illustrated in FIG. 3(b), the portion of the strain control layer 4a located on the region serving as the channel of the active layer 5 having the stacked structure formed with the strained Si layer 3a and the strain control layer 4a (or the region on which the gate is to be formed) is removed, as will be described later in another embodiment. The strain control layer 4a remains in the regions of the active layer 5 to be the source and drain. A gate insulating film is then formed on the region that is to be the channel from which the strain control layer 4a has been removed. A gate electrode is further formed on the gate insulating film. After that, impurities are introduced into the regions of the active layer 5 to be the source and drain. In this manner, a source region and a drain region are formed, and a semiconductor device is completed.

In the above description of the semiconductor device of this embodiment, the substrate is assumed to be a Si-based substrate. However, the same effects as above can be achieved with some other type of substrate. For example, it is possible to employ a substrate made of at least one element selected from IV-group materials (C, Si, Ge, Sn, and Pb) and III-V-group materials (B, Al, Ga, In, Ti, N, P, As, Sb, and Bi), or is made of glass, polymer, plastic, or a metal. Other than Si, it is possible to use BN, SiGe, Ge, SiC, GaAs, GaP, GaN, InN, InP, InGaP, InAs, InGaAl, InGaAlAs, InSb, or TiN.

Figure 6:
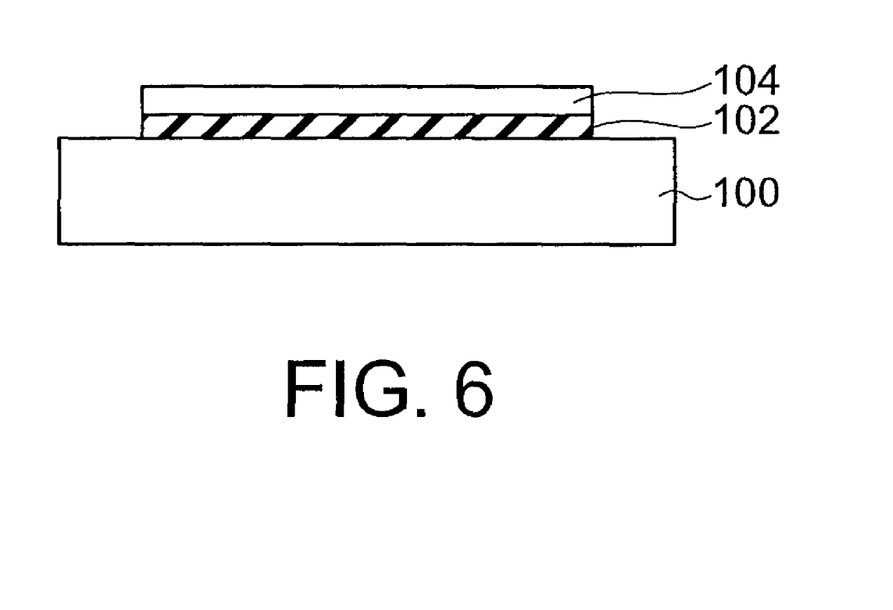
FIG. 6 is a cross-sectional view for explaining a semiconductor device according to a modification of the first embodiment.
Figure 7:
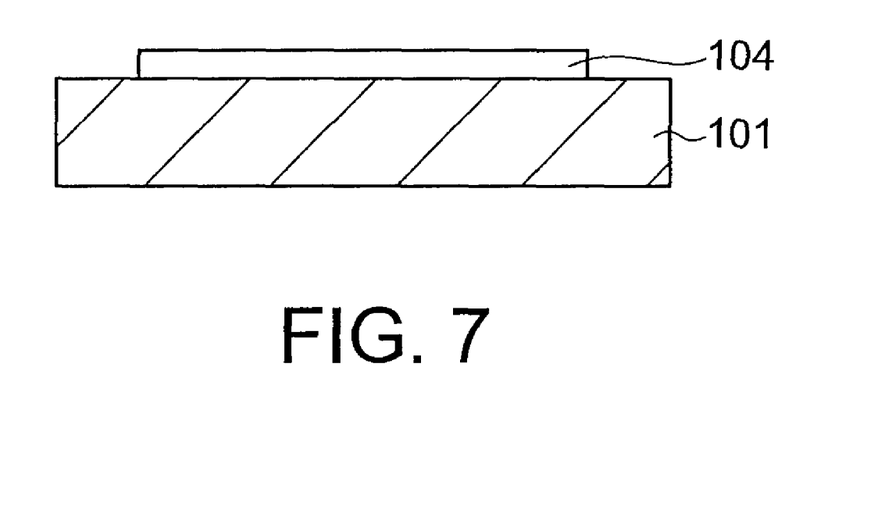
FIG. 7 is a cross-sectional view for explaining a semiconductor device according to another modification of the first embodiment.

As typically shown in FIG. 6, in a regular structure, an insulating layer 102 is formed on a substrate 100, and an active layer 104 is formed on the insulating layer 102. However, as shown in FIG. 7, the active layer 104 may be formed directly on a substrate 101, if the substrate 101 is made of an insulating material. Also, where the substrate is made of a conductive material such as a metal, it is desirable that the insulating layer 102 such as a $SiO_2$ layer or a SiN layer is provided between the active layer 104 and the substrate 100, as shown in FIG. 6.

For the semiconductor forming an active layer, it is possible to use one or combinations of IV-group crystals (C, Si, Ge, In, and Ti) and III-V-group crystals (B, Al, Ga, In, Ti, N, P, As, Sb, and Bi). In other words, other than Si, a preferred active layer can be formed with SiGe, Ge, SiC, GaAs, GaP, GaN, InP, InGaP, InAs, InGaAl, InGaAlAs, InSb, or InSe.

As described above, in this embodiment, the strain control layer for controlling beforehand a semiconductor layer to maintain as much as strain possible is provided on the semiconductor layer serving as the active layer of a device formed on a substrate. Accordingly, strain relaxation of the active layer can be restricted. Thus, in this embodiment, deterioration of the device characteristics due to unintended strain relaxation can be prevented, and characteristics deterioration caused by crystals at the time of relaxation can be restricted.

Second Embodiment

Referring now to FIGS. 8(a) through 8(d), a semiconductor device according to a second embodiment is described. The semiconductor device of this embodiment is a MOSFET, and the procedures for manufacturing the MOSFET are illustrated in FIGS. 8(a) through 8(d).

Figure 8:
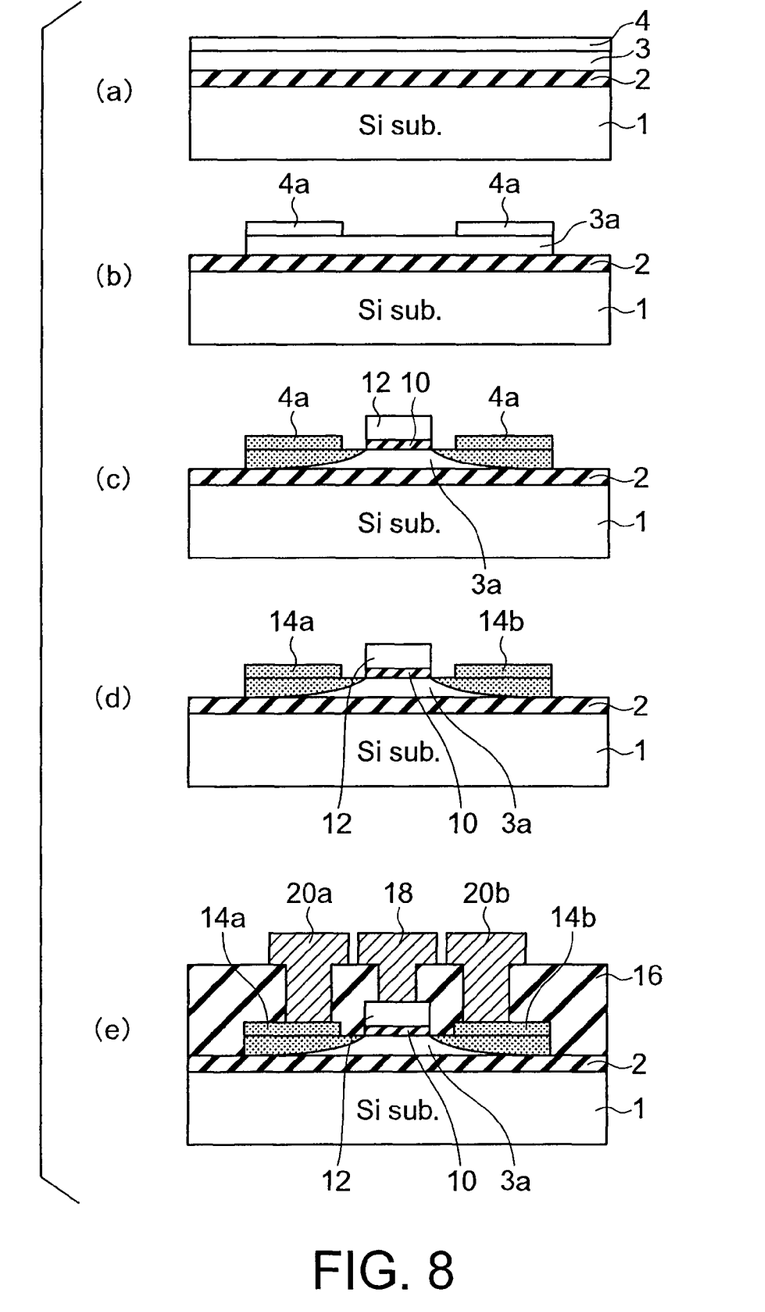
FIGS. 8(a) through 8(e) are cross-sectional views for explaining a method for manufacturing a semiconductor device according to a second embodiment.

First, as shown in FIG. 8(a), a substrate that has a strained Si layer 3 and a strain control layer 4 formed in this order on a Si substrate 1 having a buried oxide layer 2 formed therein is prepared. As shown in FIG. 8(b), with the use of a mask (not shown), patterning is performed on the strain control layer 4 and the strained Si layer 3, so as to form an active layer having a stacked structure formed with a strained Si layer 3a and a strain control layer 4a. The portion of the strain control layer 4a located on the region to be the channel of the MOSFET (the region on which the gate is to be formed) is removed. The strain control layer 4a remains in the regions of the active layer 5 to be the source and drain.

As shown in FIG. 8(c), a gate insulating film 10 is then formed on the region to be the channel from which the strain control layer 4a has been removed. A gate electrode 12 is formed on the gate insulating film 10. After that, as shown in FIG. 8(d), impurities are introduced into the regions of the active layer (the strained Si layer 3a and the strain control layer 4a) to be the source and drain, and activation annealing is performed so as to form a source region 14a and a drain region 14b. Since the strained Si layer 3a and the strain control layer 4a are thin films, the impurities to be introduced into the active layer may be introduced only into the strain control layer 4a, and diffusion may be then caused through high-temperature processing for activating the impurities, so as to introduce the impurities into the strained Si layer 3a.

As shown in FIG. 8(e), an interlayer insulating film 16 is deposited to cover the gate electrode 10, the source region 14a, and the drain region 14b. Openings reached to the gate electrode 10, the source region 14a, and the drain region 14b respectively are then formed in the interlayer insulating film 16. Those openings are filled with metal, so as to form extension metal electrodes 18, 20a, and 20b. Thus, the MOSFET is completed.

Even if the MOSFET of this embodiment formed in the above manner is made smaller in size, strain relaxation in the region to be the channel can be restricted, since the strain control layer 4a that controls the strained Si layer 3 to maintain its strain is formed on the strained Si layer 3a in the source region and the drain region. Accordingly, deterioration of the device characteristics due to unintended strain relaxation can be prevented, and characteristics deterioration caused by crystals at the time of relaxation can be restricted, as in the first embodiment.

Comparative Example 1

Figure 9:
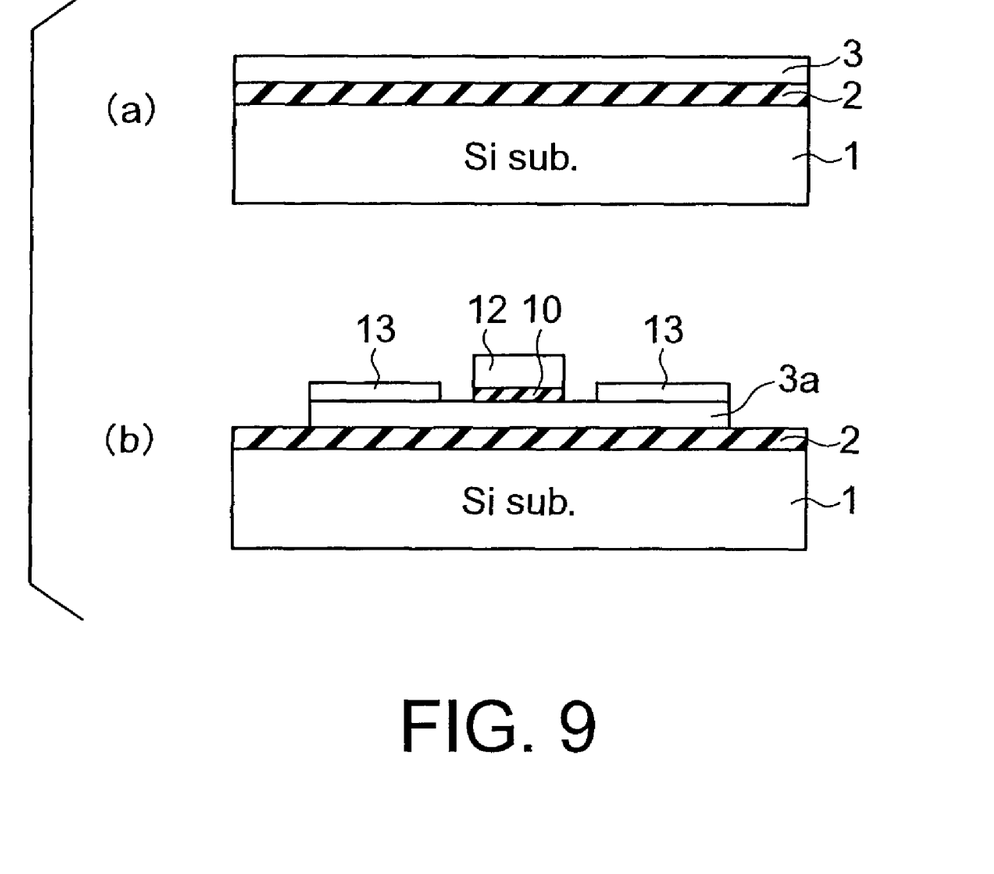
FIGS. 9(a) and 9(b) are cross-sectional views for explaining a semiconductor device according to Comparative Example 1 of the second embodiment.

Referring now to FIGS. 9(a) and 9(b), a method for manufacturing a MOSFET according to Comparative Example 1 of this embodiment is described. By the MOSFET manufacture method according to this comparative example, a Si substrate having a $SiO_2$ buried oxide layer 2 formed on a Si substrate 1 is prepared, as shown in FIG. 9(a). With the use of a mask (not shown), patterning is performed on a strained Si layer 3, so as to form an active layer formed with a strained Si layer 3a (FIG. 9(b)). A gate insulating film 10 is then formed on the active layer 3a, and a gate electrode 12 is formed on the gate insulating film 10 (FIG. 9(b)). An additional growth SiGe layer 13 for lowering the resistance of the source and drain regions is then formed by CVD (Chemical Vapor Deposition). If the strain of the strained Si layer 3a is small, a Si layer may be formed, instead of the SiGe layer 13. Impurities for forming the source and drain regions are then introduced into the additional growth SiGe layer 13, or into the additional SiGe layer and the strained Si layer 3a. Activation annealing is performed so as to form a source region 14a and a drain region 14b, as in this embodiment illustrated in FIG. 8(d). An interlayer insulating film 16 is deposited, as in this embodiment illustrated in FIG. 8(e). Openings continuing to the gate electrode 10, the source region 14a, and the drain region 14b are formed in the interlayer insulating film 16. Those openings are filled with metal, so as to form extension metal electrodes 18, 20a, and 20b. Thus, a MOSFET is completed.

In this comparative example, the SiGe layer 13 is formed after the patterning is performed on the strained Si layer 3. This comparative example differs from this embodiment in that the strain control layer for controlling the strained Si layer 3 to maintain its strain is not provided on the strained Si layer 3a after the patterning. As a result, strain relaxation is caused in the patterned strained Si layer 3a, and the SiGe layer 13 is formed on the strained Si layer 3a having the strain relaxation. Therefore, in this comparative example, strain relaxation is also caused in the region of the active layer to be the channel between the source region and the drain region, and deterioration of the device characteristics cannot be prevented.

Unlike this comparative example, the method for manufacturing the semiconductor device of this embodiment further includes the following two procedures: the procedure for preparing the strain control layer 4, and the procedure for patterning the strain control layer 4. If a device manufacturer purchases the substrate having the strain control layer 4 formed thereon from a substrate manufacturer, the device manufacturer can skip the procedure for preparing the strain control layer 4, and only has to add the procedure for patterning the strain control layer 4 to the device manufacture process. Accordingly, in this embodiment, desired strain control can be performed through the addition of the minimum number of procedures.

Comparative Example 2

Figure 10:
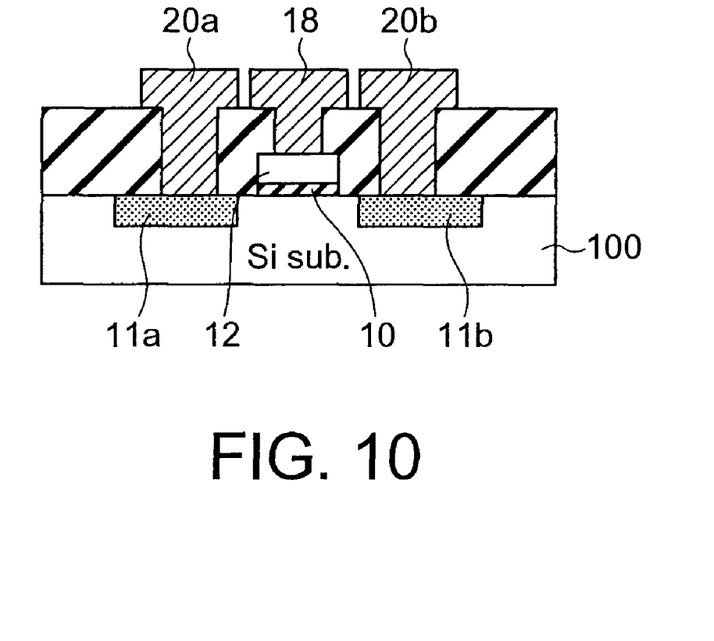
FIG. 10 is a cross-sectional view for explaining a semiconductor device according to Comparative Example 2 of the second embodiment.

FIG. 10 shows a MOSFET according to Comparative Example 2 of this embodiment. In the MOSFET according to Comparative Example 2, the portions of a bulk Si substrate 100 to be the source and drain are removed by etching, and strain is locally applied to the relaxed channel. The etched portions are filled with SiGe layers or the like having a larger lattice constant than the Si forming the channel, so as to form a source region 11a and a drain region 11b, as shown in FIG. 10. The buried SiGe layers are formed in the source region and the drain region, so as to apply sufficient strain to the originally relaxed Si channel. It is preferable that the Ge density of the buried SiGe layers 11a and 11b is high and is constant in the depth direction. Also, the buried SiGe layers 11a and 11b are formed at the same height as the channel surface.

In the MOSFET of this embodiment, on the other hand, the surfaces of the source and drain regions formed by the above described method according to this embodiment are located higher than the channel surface, since the strain control layer is formed beforehand on the active layer. Also, by the above described activation annealing, the Ge diffuses into the strained Si layer 3a below the SiGe layer 4a (FIG. 8(d)). Accordingly, density gradient might be caused in the source region 14a and the drain region 14b, with the Ge density being higher in the upper portion (on the opposite side from the substrate), the Ge density being lower in the lower portion (on the substrate side). Where the activation annealing time is short, for example, Ge diffusion might not be caused, and the SiGe/Si hetero structure might be maintained as it is. In either case, this embodiment differs from Comparative Example 2 in the Ge distribution in the source and drain regions, and in the positions of the source and drain regions with respect to the channel surface.

Comparative Example 3

Figure 11:
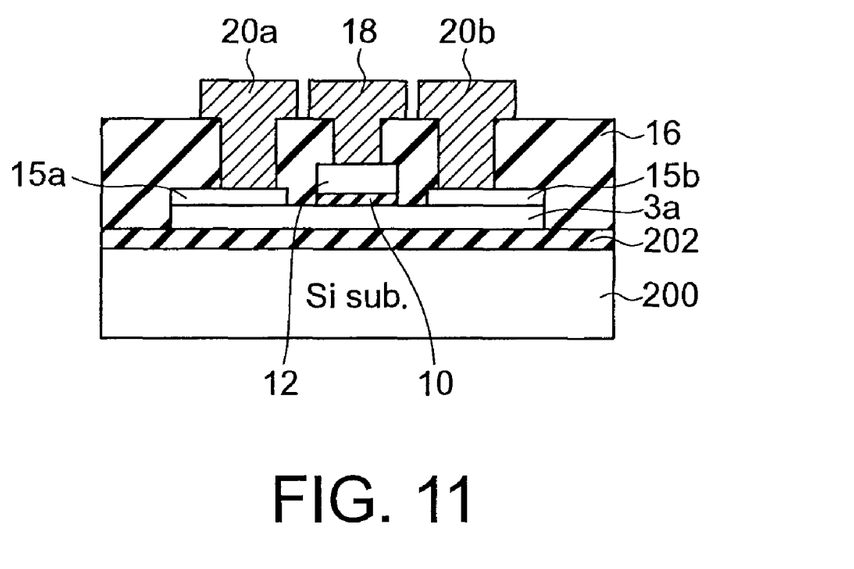
FIG. 11 is a cross-sectional view or explaining a semiconductor device according to Comparative Example 3 of the second embodiment.

FIG. 11 shows a MOSFET according to Comparative Example 3 of this embodiment. In the MOSFET according to Comparative Example 3, elevated source and drain 15a and 15b or additional source and drain 15a and 15b formed through additional crystal growth that increases the thicknesses of the source region and the drain region after the formation of a gate insulating film 10 and a gate electrode 12 are provided to lower the parasitic resistance of the source and drain regions of a SOI substrate 200 including a buried oxide layer 202. After the elevated or additional source and drain 15a and 15b are formed, an interlayer insulating film 16 is formed, and openings continuing to the gate electrode 12 and the source and drain 15a and 15b are formed in the interlayer insulating film 16. Those openings are then filled with metal, so as to form extension metal electrodes 18, 20a, and 20b.

In Comparative Example 3, Si layers that can be easily formed through crystal growth are normally used as the elevated source and drain or additional source and drain 15a and 15b, if the substrate is a Si substrate. Even if SiGe layers are used, additional crystal growth is caused after the gate formation. Therefore, strain relaxation of the Si layers prior to the gate formation cannot be restricted.

Third Embodiment

Referring now to FIGS. 12(a) through 12(e), a method for manufacturing a semiconductor device according to a third embodiment is described.

The manufacture method according to this embodiment differs from the method for manufacturing the semiconductor device of the second embodiment illustrated in FIGS. 8(a) through 8(e) in the following aspects. Before the strain control layer 4 is formed on the strained Si layer 3, a protection oxide film is formed on the region of the strained Si layer 3 on which the gate is to be formed, and the strain control layer 4 is formed on the regions to be the source and drain. After that, the protection oxide film is removed.

Figure 12:
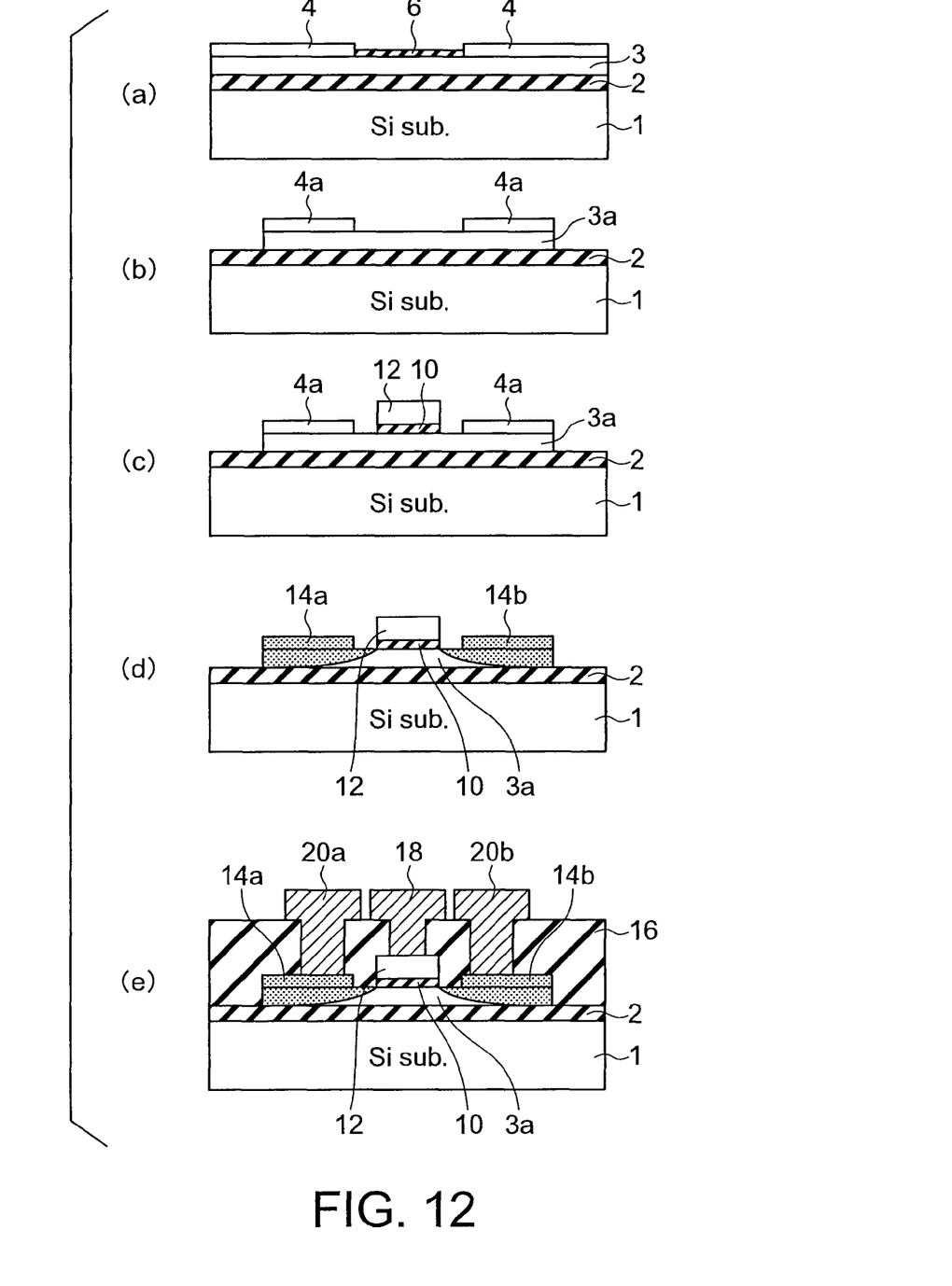
FIGS. 12(a) through 12(e) are cross-sectional views for explaining a method for manufacturing a semiconductor device according to a third embodiment.

More specifically, as shown in FIG. 12(a), a substrate that has a strained Si layer 3 formed on a Si substrate 1 having a buried oxide layer 2 formed therein is prepared. A protection oxide film 6 made of $SiO_2$ is then selectively formed on the region of the strained Si layer 3 on which the gate is to be formed, as shown in FIG. 12(a). The strain control layer 4 is formed on each of the regions to be the source and drain (FIG. 12(a)).

With the use of a mask (not shown), patterning is performed on the strain control layer 4 and the strained Si layer 3, so as to form an active layer having a stacked structure formed with a strained Si layer 3a and a strain control layer 4a, as shown in FIG. 12(b). After that, the protection oxide film is removed (FIG. 12(b)). Here, the strain control layer 4a remains in the regions of the active layer 5 to be the source and drain.

A gate insulating film 10 is formed on the region to be the channel from which the protection oxide film 6 has been removed, and a gate electrode 12 is formed on the gate insulating film 10, as shown in FIG. 12(c). Impurities are then introduced into the regions of the active layer (the strained Si layer 3a and the strain control layer 4a) to be the source and drain, and activation annealing is performed so as to form a source region 14a and a drain region 14b, as shown in FIG. 12(d). Since the strained Si layer 3a and the strain control layer 4a are thin films, the impurities to be introduced into the active layer may be introduced only into the strain control layer 4a, and diffusion may be then caused through high-temperature processing for activating the impurities, so as to introduce the impurities into the strained Si layer 3a.

As shown in FIG. 12(e), an interlayer insulating film 16 is deposited to cover the gate electrode 12, the source region 14a, and the drain region 14b. Openings continuing to the gate electrode 12, the source region 14a, and the drain region 14b are then formed in the interlayer insulating film 16. Those openings are filled with metal, so as to form extension metal electrodes 18, 20a, and 20b. Thus, the MOSFET is completed.

Even if the MOSFET of this embodiment formed in the above manner is made smaller in size, strain relaxation in the region to be the channel can be restricted, since the strain control layer 4a that controls the strained Si layer 3 to maintain its strain is formed on the strained Si layer 3a in the source region and the drain region, as in the second embodiment. Accordingly, deterioration of the device characteristics due to unintended strain relaxation can be prevented, and characteristics deterioration caused by crystals at the time of relaxation can be restricted, as in the second embodiment.

Further, as described above, the protection oxide film 6 is formed on the region of the strained Si layer 3 on which the gate is to be formed, and the strain control layer 4 is then formed in this embodiment. Accordingly, when patterning is performed on the strain control layer 4, the probability that the transistor characteristics deteriorate due to damage to the surface of the strained Si layer 3 to be the channel can be made lower by forming the protection oxide film 6. As shown in FIG. 8(b), in the patterning of the strain control layer 4, at least overetching or removal of the surface of the channel is inevitable, so as to completely expose the surface of the channel. To minimize the overetching, it is necessary to control the etching amount in the order of atomic size. For example, the etching rate is several nanometers per second, where RIE is performed on Si. In reality, etching of the surface of the channel cannot be avoided. As a result, device defects such as field concentration at the end portions or denaturation of the gate insulating film 10 due to overetching might be caused, as well as the damage to the channel. Therefore, the formation of a protection oxide film is effective to restrict the generation of causes of device defects, as in this embodiment.

In this embodiment, it is preferable that the protection oxide film 6 formed on the channel surface has such a film thickness as to be removed by vapor phase etching or liquid phase etching at least immediately before the gate stacked structure of the gate insulating film 10 and the gate electrode 12 is formed. The film thickness should typically be in the range of 0.5 nm to 50 nm. Although a $SiO_2$ film is used as the protection oxide film 6 in this embodiment, any other film may be used in practice, as long as the film can be removed before the formation of the gate stacked structures of the gate insulating film 10 and the gate electrode 12, and can restrict the damage to the surface of the strained Si layer 3a, which is to be the surface of the channel.

Also, the gate insulating film 10 of the second embodiment illustrated in FIGS. 8(a) through 8(e) and of the third embodiment illustrated in FIGS. 12(a) through 12(e) may be formed with a SiN film, a SiON film, an $Al_2O_3$ film, a $TiO_2$ film, or the like, other than the typical $SiO_2$ film. Alternatively, the gate insulating film 10 may be formed with an oxide film containing at least one element selected from the group consisting of Si, N, Ge, Hf, Zr, La, Ta, Pr, Ti, and Al.

Figure 13:
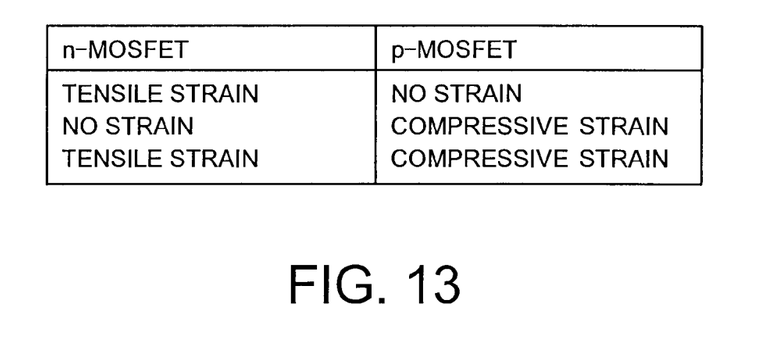
FIG. 13 shows preferred combinations of strain applied to an n-MOSFET and a p-MOSFET.

The strain control layer 4 in the first through third embodiments mainly plays the following two roles: maintaining the strain already applied to the channel that might be relaxed by miniaturization of the device; and actively applying strain to a relaxed channel. FIG. 13 shows combinations of strain application to an n-MOSFET and strain application to a p-MOSFET in a typical CMOS device that are preferable in view of the above two aspects. As described in the first embodiment, the SiGe strain control layer 4 is necessary to prevent relaxation of the tensile strain of the Si channel (or to maintain the strain). In this case, it is preferable that the strain control layer 4 has strain that is equivalent to the lattice constant of a strained channel or is equivalent to ±10% or less of the lattice constant of the channel, or has a lattice constant that is ±10% or less of the lattice constant of the channel. More preferably, the strain control layer 4 typically has strain equivalent to ±4% or less of the lattice constant of the channel, or has a lattice constant that is ±4% or less of the lattice constant of the channel.

To obtain a Si channel having tensile strain, a SiGe or Ge strain control layer having a high-density Ge composition with respect to a strain-relaxed Si layer may be formed on the strain-relaxed Si layer, and strain may be applied from the strain control layer. If the strain control layer has strain or a lattice constant equivalent to ±10% or less of the lattice constant of the channel, the strain can cause the channel to apply further strain to the Si layer, so as to restrain deterioration of crystallinity due to the bonding between layers having different lattice constants in this case. Here, it is desirable that the strain or lattice constant of the strain control layer is typically equivalent to a value in the range of 1% to 10% of the lattice constant of the channel.

Meanwhile, to obtain a Ge or SiGe channel having compressive strain, a GOI (Ge on Insulator) substrate or a SGOI substrate having compressive strain applied thereto in advance may be used, or a Si strain control layer may be formed so as to apply strain to a strain-relaxed Ge or SiGe layer.

A source and drain direction (or the channel length direction) that is parallel to the <100> axis direction on the (001) plane is typically formed in the channel. To further improve the device characteristics, the source and drain direction should be formed on the (001) plane in the case of an n-MOSFET of a flat-type MOSFET, and should be formed on the (110) plane in the case of a p-MOSFET. In this manner, a high-performance device can be obtained. In other words, the characteristics can be improved by adjusting the combination of the plane orientation and the strain direction, and the present invention can be applied to a so-called hybrid substrate in which channels having different axial directions are formed in different plane orientations are formed on a single base. Accordingly, the plane orientations can be arbitrarily selected, and the present invention can be applied not only to flat-type MOSFETs, but also to three-dimensional MOSFET devices having Fin, ω, π, narrow-wire, ballistic, or GAA (gate-all-around) structures expected to be used in the future, and to MEMS sensors and actuators. The present invention is also characterized in that those selections can be applied arbitrarily and independently to the respective types of the devices.

Fourth Embodiment

Figure 14:
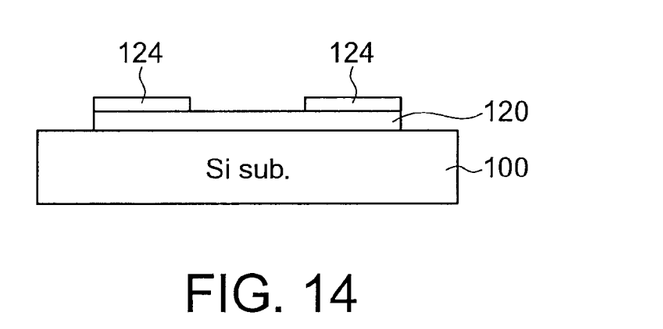
FIG. 14 is a cross-sectional view for explaining a semiconductor device according to a modification of the third embodiment.

Referring now to FIG. 14, a semiconductor device according to a fourth embodiment is described. FIG. 14 is a cross-sectional view showing the semiconductor device of this embodiment. The semiconductor device of this embodiment differs from those of the first through third embodiments in that the insulating layer 2 is not provided on the Si substrate, and a strained semiconductor layer is formed directly on the Si substrate. Also, a SiGe layer 120 formed on the Si substrate 100 is a compressive strain layer, while the strained Si layer in the first through third embodiments is a tensile strain layer. In this case, obvious relaxation is caused when the strained layer 120 on the Si substrate 100 is formed into a small-size mesa shape. To counter this problem, a Si layer 124 is formed as a strain control layer on the SiGe layer 120 having edges compressive strain, and the SiGe layer 120 is then formed into a mesa shape. In this manner, the SiGe layer 120 that has compressive strain and is prevented from relaxing its strain can be obtained. After this procedure, a MOSFET can be completed by the method according to the second and third embodiments.

According to this embodiment, strain relaxation can be restricted, even if a strained semiconductor element is formed on a very small active layer.

A Si layer is used as the strain control layer 124 in this embodiment. However, it is preferable that the strain control layer 124 has strain that is equivalent to the lattice constant of the SiGe layer 120 or is equivalent to ±10% or less of the lattice constant of the SiGe layer 120, or has a lattice constant that is ±10% or less of the lattice constant of the SiGe layer 120. More preferably, the strain control layer typically has strain equivalent to ±4% or less of the lattice constant of the SiGe layer 120, or has a lattice constant that is ±4% or less of the lattice constant of the SiGe layer 120.

In a semiconductor device as a modification of this embodiment, an insulating layer may be provided between the Si substrate 100 and the SiGe layer 120. The semiconductor device of this modification is the same as the semiconductor device of the second embodiment, except that the SiGe layer 120 is used in place of the strained Si layer 3a on the insulating layer 2, and the Si strain control layer 124 is provided in place of the strain control layer 4a.

In this modification, strain relaxation can be restricted, even if a strained semiconductor element is formed on a very small active layer, as in the fourth embodiment.

Figure 15:
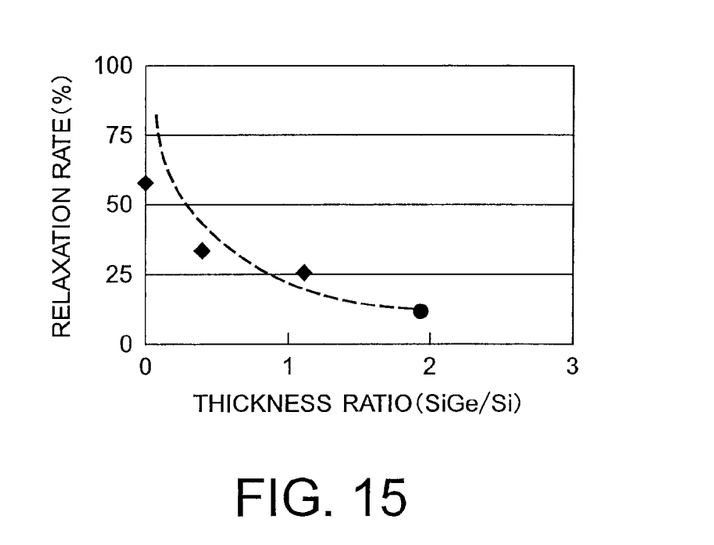
FIG. 15 shows the dependence of the strain relaxation rate on the ratio between the thickness of the strain control layer and the thickness of the strained Si layer serving as the channel.

Referring now to FIG. 15, the fact that the semiconductor devices of the first through fourth embodiments can be actually formed is described. FIG. 15 shows the results of examinations carried out on the same samples used in the first embodiment, to check the dependence of strain relaxation on the ratio between the thickness of the strain control layer 4a and the thickness of the strained Si layer 3a serving as the channel. In other words, FIG. 15 is a graph, with the ratio between the thickness of the strain control layer 4a and the thickness of the strained Si layer 3a as the channel being plotted on the abscissa axis, the strain relaxation rate being plotted on the ordinate axis. In each of the samples, the lattice constant of the strained Si layer 3a is substantially the same as the lattice constant of the strain control layer 4a. As can be seen from FIG. 14, to restrict the strain relaxation rate of the strained Si layer 3a serving as the channel to approximately 10% after the device formation, the strain control layer 4a needs to have a thickness twice as large as the thickness of the strained Si layer 3a. This implies that the strain relaxation rate (the residual strain ratio) is expressed by and determined according to the following expression:

$$1-\exp(-t)$$

where t represents the ratio between the thickness of the strain control layer 4a and the thickness of the strained Si layer 3a. For example, in one of the samples used in this experiment, the thickness of the strained Si channel layer 3a serving as the channel is 50 nm, and the composition of the SiGe layer that is the strain control layer 4a is approximately 24%. In that case, the strain relaxation rate of the strained Si layer 3a can be restricted to approximately 1%, if the thickness of the strain control layer 4a is approximately 100 nm. Since the thickness of the source and drain formed through additional growth is normally in the range of 10 nm to 1000 nm, the strain control layer 4a of each of the first through third embodiments can be formed through the additional growth.

As described so far, according to each of the above embodiments, the strain relaxation of the channel can be restricted, and a high-performance semiconductor device can be realized even if elements are miniaturized. The strain relaxation of the channel in miniaturizing of a semiconductor element can be restricted by adding only two steps to a conventional process for manufacturing the semiconductor device. Accordingly, high-quality, high-performance semiconductor devices can be realized without a remarkable increase in the number of manufacturing procedures, while the cost of development is prevented from becoming higher by using conventional processing techniques.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
   a substrate;
   a first semiconductor layer having
      a first lower face facing an upper face of the substrate, a first upper face opposed to the first lower face, a pair of first and second side faces different from the first lower face and the first upper face, the second side face opposed to the first side face, and a pair of third and fourth side faces different from the first lower face, the first upper face, and the pair of the first and second side faces, the fourth side face opposed to the third side face, the first semiconductor layer formed into a mesa shape above the substrate and having strain, and including source and drain regions of a first conductivity type located at a distance from each other in a direction heading from the first side face to the second side face, and a channel region of a second conductivity type different from the first conductivity type, the channel region being located between the source region and the drain region;

a second semiconductor layer having a second lower face facing the first upper face of the first semiconductor layer, a second upper face opposed to the second lower face, a pair of fifth and sixth side faces different from the second lower face and the second upper face, the sixth side face opposed to the fifth side face, and a pair of seventh and eighth side faces different from the second lower face, the second upper face, and the pair of the fifth and sixth side faces, the fifth side face and the first side face disposed in a first vertical plane, the seventh side face and the third side face disposed in a second vertical plane, and the eighth side face and the fourth side face disposed in a third vertical plane, the second semiconductor layer formed on the source region to contain impurities of the first conductivity type, the second semiconductor layer having a lattice constant that is ±10% or less of a lattice constant of the channel region of the first semiconductor layer;

a third semiconductor layer having a third lower face facing the first upper face of the first semiconductor layer, a third upper face opposed to the third lower face, a pair of ninth and tenth side faces different from the third lower face and the third upper face, the tenth side face opposed to the ninth side face, and a pair of eleventh and twelfth side faces different from the third lower face, the third upper face, and the pair of the ninth and tenth side faces, the twelfth side face opposed to the eleventh side face, the tenth side face and the second side face disposed in a fourth vertical plane, the eleventh side face and the third side face disposed in the second vertical plane, and the twelfth side face and the fourth side face disposed in the third vertical plane, the third semiconductor layer formed on the drain region to contain impurities of the first conductivity type, the third semiconductor layer having a lattice constant that is ±10% or less of a lattice constant of the channel region of the first semiconductor layer;

a gate insulating film formed on the channel region; and a gate electrode formed on the gate insulating film.

2. The device according to claim 1, further comprising an insulating layer provided between the first semiconductor layer and the substrate.

3. The device according to claim 1, wherein the first semiconductor layer is a strained Si layer, and the second and third semiconductor layers are SiGe layers.

4. The device according to claim 1, wherein the first semiconductor layer is a strained SiGe layer, and the second and third semiconductor layers are Si layers.

* * * * *